United States Patent
El Khourassani et al.

(10) Patent No.: US 10,698,843 B2
(45) Date of Patent: Jun. 30, 2020

(54) METHOD FOR MANAGING ROUTING OF TRANSACTIONS BETWEEN SOURCE DEVICES AND AT LEAST ONE TARGET DEVICE AND CORRESPONDING SYSTEM ON CHIP

(71) Applicant: STMicroelectronics (Rousset) SAS, Rousset (FR)

(72) Inventors: Yassine El Khourassani, Antibes (FR); Patrick Valdenaire, Roquefort les Pins (FR); Emmanuel Ardichvili, Valbonne (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/274,871

(22) Filed: Feb. 13, 2019

(65) Prior Publication Data
US 2019/0266108 A1    Aug. 29, 2019

(30) Foreign Application Priority Data

Feb. 27, 2018    (FR) ..................... 18 51676

(51) Int. Cl.
| | | |
|---|---|---|
| *G06F 13/16* | (2006.01) | |
| *G06F 13/40* | (2006.01) | |
| *G11C 7/10* | (2006.01) | |

(52) U.S. Cl.
CPC .......... *G06F 13/16* (2013.01); *G06F 13/1652* (2013.01); *G06F 13/4022* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 5,495,570 A * | 2/1996 | Heugel | G06F 11/2087 714/11 |
| 6,823,411 B2 * | 11/2004 | Hofmann | G06F 13/364 709/208 |

(Continued)

FOREIGN PATENT DOCUMENTS

| | | |
|---|---|---|
| EP | 1760723 A2 | 3/2007 |
| WO | 2009153624 A1 | 12/2009 |

OTHER PUBLICATIONS

Gerstlauer, Andreas "EE382V: System-on-Chip (SoC) Design—Lecture 12—SoC Communication Architecture," Electrical and Computer Engineering, University of Texas at Austin, 2014, 43 pages. http://users.ece.utexas.edu/~gerstl/ee382v_f14/lectures/lecture_12.pdf.

(Continued)

*Primary Examiner* — Raymond N Phan
(74) *Attorney, Agent, or Firm* — Slater Matsil, LLP

(57) ABSTRACT

An interconnect circuit includes a plurality of input interfaces and a plurality of output interfaces. A plurality of source devices are respectively coupled to the input interfaces. A target device has a plurality of access ports respectively coupled to the output interfaces. Each source device is configured to deliver transactions to the target device. Programmable control circuit is configured to deliver, to the interconnect circuit, a control word designating an access port assigned to this source device. The interconnect circuit is configured to route the transaction from the corresponding input interface to the output interface that is coupled to this access port and to deliver the transaction to the access port, the content of each transaction delivered to an access port being identical to the content of the corresponding transaction delivered by the source equipment whatever the selected access port.

23 Claims, 3 Drawing Sheets

(52) U.S. Cl.
CPC ........ *G11C 7/1075* (2013.01); *G06F 13/1684* (2013.01); *G06F 2213/0038* (2013.01); *G11C 7/10* (2013.01)

(56) References Cited

U.S. PATENT DOCUMENTS

| | | | | |
|---|---|---|---|---|
| 6,901,552 | B1* | 5/2005 | Fey | G06F 11/1008 |
| | | | | 714/800 |
| 6,959,400 | B2* | 10/2005 | Peleska | G05B 19/0428 |
| | | | | 714/6.32 |
| 2008/0271054 | A1* | 10/2008 | Allison | G06F 11/1666 |
| | | | | 719/319 |
| 2011/0082970 | A1* | 4/2011 | Rohleder | G06F 11/1666 |
| | | | | 711/104 |

OTHER PUBLICATIONS

Venkateswara Rao et al., entitled "A Frame work on AMBA bus based Communication Architecture to improve the Real Time Computing Performance in MPSoC," International Journal of Computer Applications (0975-8887), vol. 91—No. 5, Apr. 2014, 5 pages.

* cited by examiner

METHOD FOR MANAGING ROUTING OF TRANSACTIONS BETWEEN SOURCE DEVICES AND AT LEAST ONE TARGET DEVICE AND CORRESPONDING SYSTEM ON CHIP

CROSS-REFERENCE TO RELATED APPLICATIONS

This application claims the benefit of French Application No. 1851676, filed on Feb. 27, 2018, which application is hereby incorporated herein by reference.

TECHNICAL FIELD

Embodiments relate to the routing of transactions between source devices and at least one target device (for example, but non-limitingly, a multiport memory) within a system on chip (SoC).

BACKGROUND

Source devices routinely communicate with a target device (e.g. a multiport memory). The communication may include transactions (e.g. read or write commands for a multiport memory) that may need to be routed to an appropriate access port of the target device. There is a need to be able to manage such routing flexibly depending on the envisaged application.

SUMMARY

According to one aspect, a system on chip is proposed. The proposed system on chip includes an interconnect circuit including a plurality of input interfaces and a plurality of output interfaces, a plurality of source devices respectively coupled to the input interfaces, at least one target device (for example a multiport memory) having a plurality of access ports respectively coupled to the output interfaces, each source device being configured to deliver transactions (for example read or write transactions) to the at least one target device.

The transactions emitted by the various source devices may be emitted sequentially or simultaneously.

When a plurality of target devices are provided, they may all receive transactions originating from all the source devices or indeed certain of these target devices may receive transactions from only certain source devices.

The system on chip also contains programmable control circuit that are able, once programmed, to deliver, to the interconnect circuit, in the presence of each transaction originating from a source device, a control word designating an access port assigned to this source device, the interconnect circuit then being configured to route the transaction from the corresponding input interface to the output interface that is coupled to this access port and to deliver the transaction to the access port, the content of each transaction delivered to an access port being identical to the content of the corresponding transaction delivered by the source equipment whatever the selected access port.

Thus, the interconnect circuit is configured to receive with each transaction a control word and to route the transaction to one of the access ports depending on the value of this control word.

Thus, depending on the envisaged application, i.e. for example depending on the nature of the source devices, the user will be able to program, for each source device, the value of the corresponding control word so as to always route the transactions originating from this source device to the chosen access port.

Moreover, whatever the access port chosen for a transaction originating from a source device, the content of this transaction delivered to the access port is identical to the content of the transaction delivered by the source device. In other words, if for example the target device is a dual port memory, and if the transaction includes a memory write address, the transaction must not be disrupted by the control word, i.e. its content must be identical whatever the access port of the memory, so that the transaction allows the same address in the memory space of the memory to be pointed to no matter which of the two access ports the transaction is received on.

Thus, the same system on chip may be used for various applications requiring allocations of different access ports.

According to one implementation, one particularly simple way of ensuring that the content of each transaction delivered to an access port is identical to the content of the corresponding transaction delivered by the source device no matter which access port is selected, is to make provision for each transaction to be routed conjointly with the control word to the corresponding output interface, and for the output interface to be configured to not deliver the control word to the corresponding access port.

According to one embodiment, each transaction is incorporated within a main word of n bits whereas the control word includes m additional bits.

The value of m is at least equal to 1 and depends on the number of access ports to select from.

Thus, if the number of access ports is equal to 2, m will possibly be equal to 1. If the number of access ports is equal to 3 or 4, m will be equal to 2.

The value of the m bits allows the control circuit to be programmed so as to designate the access port assigned to the source device.

Each input interface is then configured to receive an overall word of n+m bits including the main word and the control word.

The interconnect circuit is then advantageously configured to route the overall word to the corresponding output interface, and the output interface is advantageously configured to not deliver the control word to the access port.

According to one embodiment, each input interface is coupled to the corresponding source device by an n-track input bus and to the control circuit by an m-track control bus.

The overall word of n+m bits is intended to be routed over a network of n+m track internal buses within the interconnect circuit.

Each output interface is configured to receive an internal bus of n+m bits and is coupled to the corresponding access port by an n-track output bus, and the m tracks of the n+m track internal bus leading to the corresponding output interface are not connected to the access port.

It is possible for the control circuit to be programmable by one of the source devices, for example by a programmable core or a (micro) processor.

When the at least one target device is a multiport memory circuit, the transaction includes an address of the physical memory space of the memory circuit.

According to another aspect, a method is proposed for managing the routing of transactions within a system on chip between a plurality of source devices delivering the transactions and at least one target device having a plurality of access ports.

The method according to this aspect includes the following steps:

- equipping the system on chip with an interconnect circuit including a plurality of input interfaces and a plurality of output interfaces,
- respectively coupling the input interfaces to the source devices and respectively coupling the output interfaces to the access ports,
- configuring each input interface so that it is able to receive each transaction originating from the corresponding source device and a control word of programmable value associated with this transaction,
- configuring the interconnect circuit so that each transaction and its control word are routed to one of the output interfaces depending on the value of the control word,
- configuring each output interface so that the corresponding transaction is delivered to the access port coupled to this output interface and so that the corresponding control word is not delivered to this access port, and for each source device, programming the value of the corresponding control word so as to assign an access port to all the transactions originating from this source device.

According to one implementation, the method includes loading into one of the source devices, for example a programmable core or a (micro)processor, a software application containing instructions for programming the various control words, and programming the various control words during an execution of the software application.

The at least one target device may be a multiport memory circuit and the transaction may then include an address of the physical memory space of the memory circuit.

BRIEF DESCRIPTION OF THE DRAWINGS

Other advantages and features of the invention will become apparent from the completely non-limiting detailed description of embodiments and implementations and from the appended drawings, in which.

DETAILED DESCRIPTION OF ILLUSTRATIVE EMBODIMENTS

Figure 1:
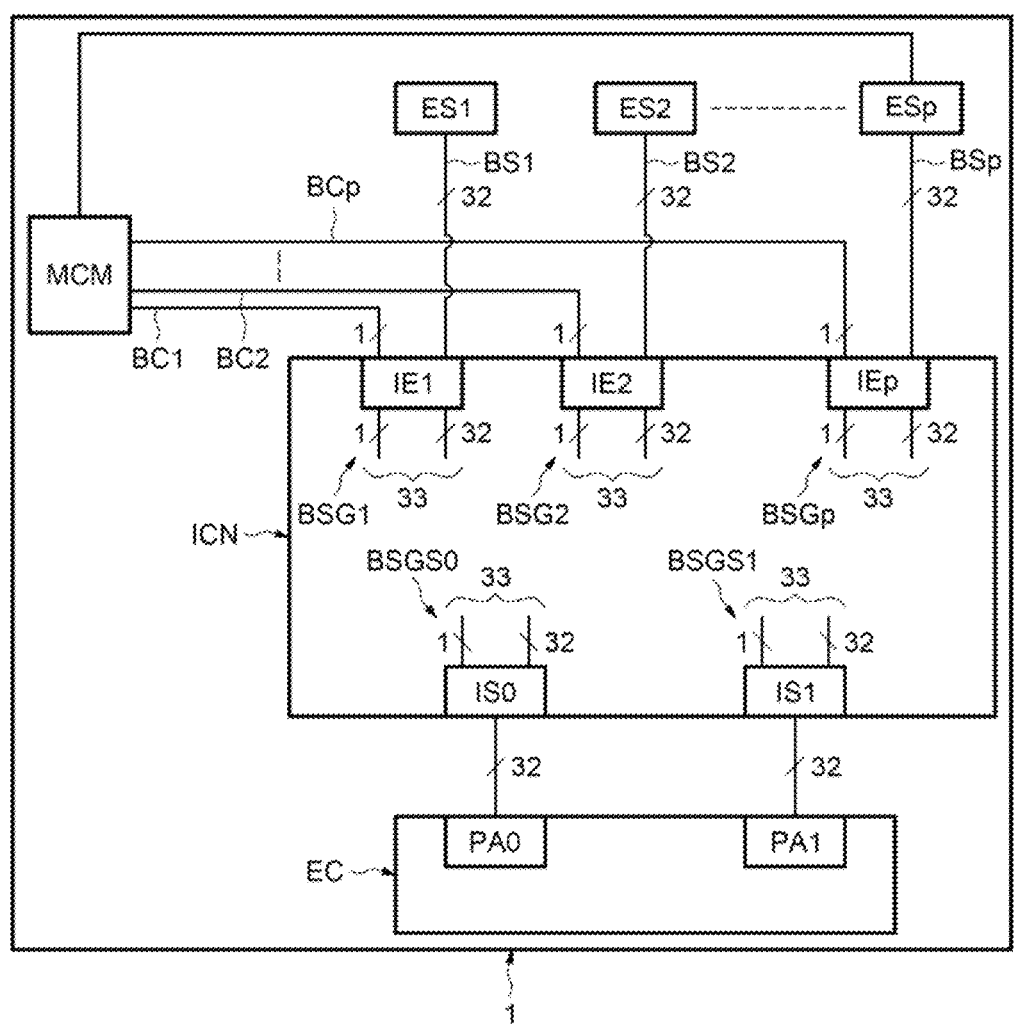
FIGS. 1 to 3 schematically illustrate embodiments and implementations of the invention.

In FIG. 1, the reference 1 designates a system on chip including a plurality of source devices ES1-ESp that may possibly be of different natures.

Thus, one of the devices, for example the device ES1, may be an LCD sensor, another device, for example the device ES2, may be a processor for processing signals, another source device may for example be a decoder and another source device, for example the device ESp, may be a microprocessor, for example the microprocessor sold by STMicroelectronics under the reference STM32.

The system on chip 1 also includes at least one target device EC, for example a multiport memory, here a memory including two access ports PA0 and PA1.

Of course, a plurality of target devices, of identical or different nature, may be provided on the system on chip 1.

In order to interconnect the source devices ES1 and the target device EC, the system on chip 1 also includes an interconnect circuit ICN.

This interconnect circuit includes input interfaces IE1-IEp that are respectively coupled to the source devices ES1-ESp and output interfaces IS0, IS1 that are respectively coupled to the access ports PA0-PA1 of the target device EC.

Such an interconnect circuit is capable of routing transactions between the various source devices and the one or more target devices.

The transactions may for example be memory write or read transactions, for example, if the target device EC is a memory.

The structure of such an interconnect circuit, which is in general a multilayer interconnect circuit, and the protocol allowing transactions to be exchanged and routed in the interior of the interconnect circuit are well known to those skilled in the art.

With regards to the interconnect circuit ICN, reference may, for example, be made to the following:

to the article by Venkateswara Rao et al. entitled "A Framework on AMBA bus based Communication Architecture to improve the Real Time Computing Performance in MPSoC", International Journal of Computer Applications (0975-8887), Volume 91-No. 5, April 2014, or to a general presentation of these interconnect circuits which was given in 2015 by A. Gerstlauer and is available at the Internet address http://users.ece.utexas.edu/~gerstl/ee382v_f14/lectures/lecture_12.pdf.

Moreover, by way of non-limiting indication, it is for example possible to use the interconnect circuit sold by ARM under the reference NIC-400 (version Rop3).

As illustrated in FIG. 1, each input interface IEi of the interconnect circuit ICN is connected to the corresponding source device ES1 by an n-bit bus BSi.

In the example described here, the bus is a 32-bit bus.

Each transaction originating from a source device ES1 is incorporated into an n-bit word called the "main word", which is transmitted over the bus BSi.

As is known in the art, a transaction, for example a write transaction, in particular contains an address field and control bits and a field of data to be written.

For example, the address contained in the transaction may be coded on 16 bits.

The system on chip 1 moreover includes control circuit MCM, for example registers that are respectively assigned to the various source devices ES1-ESp and respectively connected to the corresponding input interfaces IE1-IEp by buses BC1-BCp.

Each of the input interfaces IE1-IEp of the interconnect circuit ICN is therefore coupled to an n+m bit bus.

The size of the m of each bus BCi depends on the number of access ports of the one or more target devices EC.

In the present case, since the device EC has two access ports PA0 and PA1, m equals 1.

Each register therefore contains 1 bit forming a control word that will be transmitted over the corresponding bus BCi conjointly with the 32-bit main word containing the transaction.

In the example described here, the values of the registers are programmed by one of the source devices, in the present case the source device ESp, which here, for example, is an STM 32 microprocessor.

The 32-bit main word and the 1-bit control word form a 33-bit overall word.

Generally, the various 33-bit overall words BSGi are transmitted to the various output interfaces IS0, IS1 by a network of n+m track internal buses.

In the example described here (n=32 and m=1), the various 33-bit overall words BSGi are transmitted to the various output interfaces IS0, IS1 by a network of 33-track internal buses.

Each output interface is therefore configured to receive an n+m bit internal bus (33-bit bus in this example), in the present case BSGS0 for the interface IS0 and BSGS1 for the interface IS1.

In contrast, as illustrated in FIG. 1, only the n tracks (n=32 in this example) of the buses BSGS0 and BSGS1 intended to contain the transaction are connected to the access ports PA0, PAL In other words, the m tracks (here the 33rd track) transmitting the m-bit control word (here the 1-bit control word) are not connected to the corresponding access port.

Thus, the transaction delivered to an access port is identical to the transaction originating from a source device, whatever the selected access port.

Depending on the value of the control word contained in a register of the control circuit MCM, the transaction originating from the corresponding source device will be routed either to the output interface IS0, and therefore to the access port PA0, or to the exit interface IS1 and therefore to the access port PA1.

Thus, by way of non-limiting example, in the case where m=1, if the value of the bit contained in a register is equal to 0, the transaction will be routed to the access port PA0, whereas, if the value of the bit is equal to 1, the transaction will be routed to the access port PAL In fact, in practice, the control bit is for example the most significant bit of the address word contained in the transaction.

Thus, if the address word contained in the transaction is a 16-bit word, the address word transmitted over the network of internal buses of the interconnect circuit is a 17-bit word. The interconnect circuit therefore interprets the 17-bit word as a 17-bit address. The interconnect circuit is then configured to route this 17-bit word either to the output interface IS0 or to the output interface IS1 depending on the value of the most significant bit.

An interconnect circuit is configured in a conventional way, for example in VHDL. Then this VHDL is converted into a hardware circuit including a control circuit, switches and buses and the various paths of which are defined by the configuration of the interconnect circuit.

Figure 2:
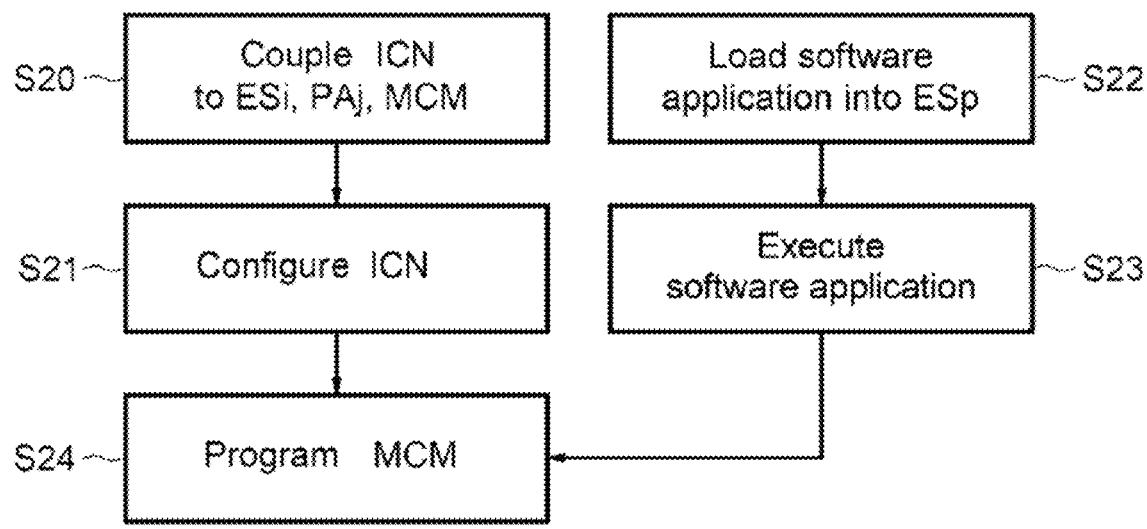

An example of management of the routing of transactions is illustrated in FIG. 2.

In a first step S20, the interconnect circuit ICN is coupled to the various source devices ES1, to the various access ports PAj and to the control circuit MCM.

Next, in a step S21, the interconnect circuit ICN is configured so that whether or not a transaction is routed to a given access port depends on the logic value of the control bit associated with this transaction.

Of course, although in FIG. 2 step S21 is shown after step S20, it is of course entirely envisageable to firstly configure the interconnect circuit ICN so as to produce it in hardware form and then to couple this interconnect circuit ICN to the source devices ES1, the access ports PAj, and the control circuit MCM.

In a step S22, a software application that contains instructions for programming the values of the registers MCM is loaded into the source device ESp, which in the present case is a microprocessor.

Thus, during the execution of the software application (step S23), the circuit MCM are programmed (step S24).

Figure 3:
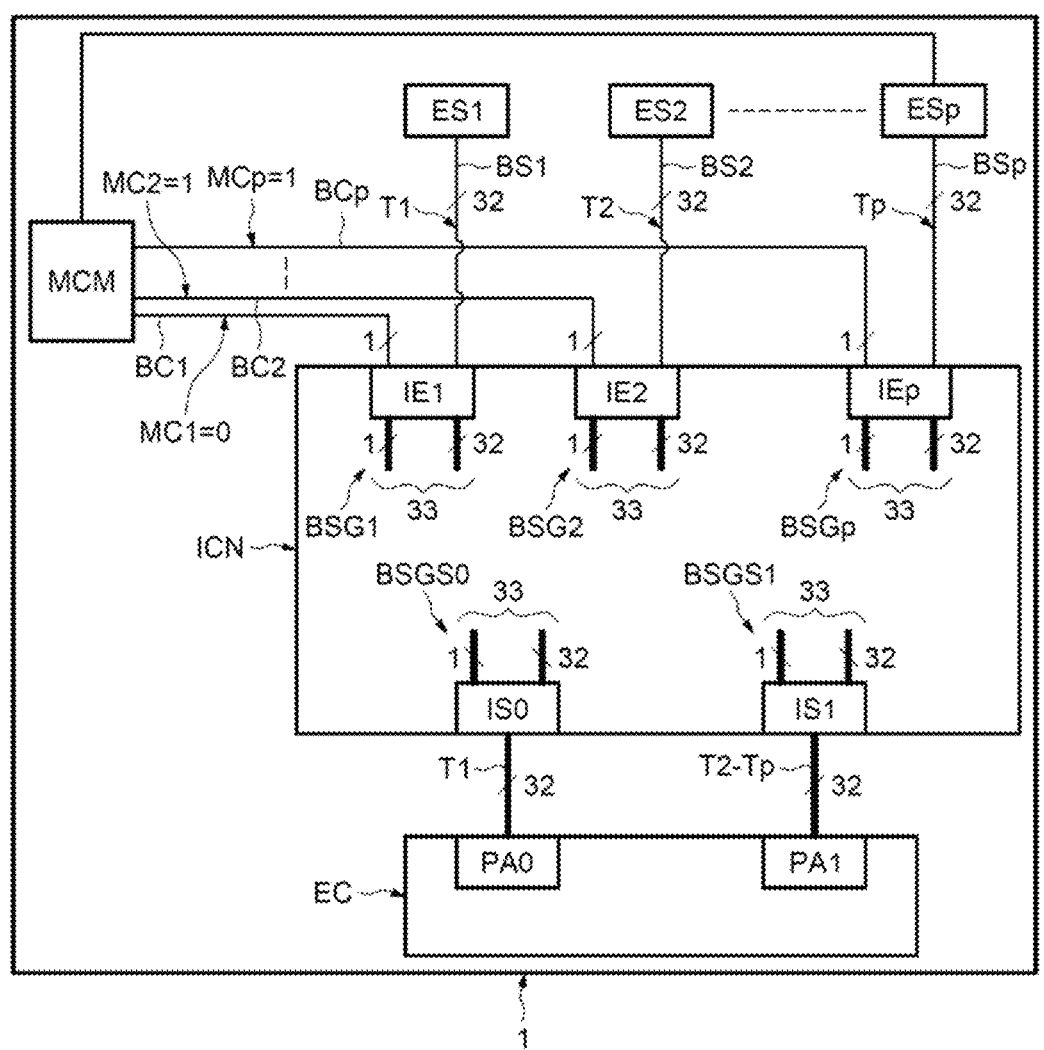

Thus, for example, as illustrated in FIG. 3, the programming is assumed to result in a control word MC1 that is equal to 0 for the source device ES1 and in control words MC2, MCp that are equal to 1 for the other source devices ES2-ESp.

Thus, any transaction T1 originating from the source device ES1 will be routed to the output interface IS0 and therefore to the access port PA0.

In contrast, any transaction originating from the other source devices ES2-ESp, for example the transactions T2-Tp, will be routed to the output interface IS1 and therefore to the access port PA1.

What is claimed is:

1. A system on chip, comprising:
an interconnect circuit comprising a plurality of input interfaces and a plurality of output interfaces;
a plurality of source devices respectively coupled to the plurality of input interfaces;
a multiport memory device comprising a plurality of access ports respectively coupled to the plurality of output interfaces, a respective source device of the plurality of source devices being configured to deliver a respective transaction to the multiport memory device, wherein the respective transaction comprises an address of a physical memory space of the multiport memory device, the address identifying the same physical memory space regardless of which of the access ports receives the address; and
a programmable control circuit configured to deliver, to the interconnect circuit and in a presence of the respective transaction, a respective control word designating a selected access port, the selected access port being a respective access port assigned to the respective source device, wherein the interconnect circuit is configured to route the respective transaction from the input interface receiving the respective transaction to a respective output interface that is coupled to the respective access port and to deliver the respective transaction to the respective access port, wherein a content of the respective transaction delivered to the respective access port is identical to a content of the respective transaction delivered by the respective source device to the input interface irrespective of the selected access port.

2. The system on chip according to claim 1, wherein the respective transaction is routed conjointly with the respective control word to the respective output interface, and wherein the respective output interface is configured to not deliver the respective control word to the selected access port.

3. The system on chip according to claim 1, wherein the programmable control circuit is programmable by one of the plurality of source devices.

4. The system on chip according to claim 2, wherein the respective transaction delivered by the respective source device to the input interface is incorporated within a respective main word of n bits, wherein the respective control word comprises m additional bits, a value of m being at least equal to one and being dependent on a number of the plurality of access ports to select from, wherein the m additional bits designate a respective access port to a respective source device, and wherein a respective input interface is configured to receive a respective overall word of n+m bits comprising the respective main word and the respective control word, the interconnect circuit being configured to route the overall word to the respective output interface, the respective output interface being configured to not deliver the respective control word to the selected access port.

5. The system on chip according to claim 3, wherein the one of the plurality of source devices comprises a programmable core or a microprocessor.

6. The system on chip according to claim 3, wherein the one of the plurality of source devices incorporates a software application containing instructions configured to program the programmable control circuit.

7. The system on chip according to claim 4, wherein the respective input interface is coupled to the respective source device by an n-track input bus and to the respective control circuit by an m-track control bus, the respective overall word of n+m bits being configured to be routed over a network of n+m track internal buses within the interconnect circuit, each output interface being configured to receive a respective n+m bit internal bus and being coupled to the respective access port by a respective n-track output bus, the m tracks of the respective n+m bit internal bus leading to the respective output interface not being connected to the respective access port.

8. A method for managing routing of transactions within a system on chip between a plurality of source devices delivering the transactions and a multiport memory device comprising a plurality of access ports, the system on chip including an interconnect circuit comprising a plurality of input interfaces and a plurality of output interfaces, the method comprising:
respectively coupling the plurality of input interfaces to the plurality of source devices and respectively coupling the plurality of output interfaces to the plurality of access ports;
configuring each input interface so that it is able to receive a respective transaction originating from a respective source device and a respective control word of programmable value associated with the respective transaction, wherein the respective transaction comprises an address of a physical memory space of the multiport memory device;
configuring the interconnect circuit so that the respective transaction and the respective control word are routed to one of the plurality of output interfaces depending on a value of the respective control word;
configuring a respective output interface so that its respective transaction is delivered to the access port coupled to the respective output interface and so that the respective control word is not delivered to the access port coupled to the respective output interface, the address of the respective transaction for accessing the same physical memory space regardless of which access port of the multiport memory device receives the address; and
for each source device, designating a value of the respective control word so as to assign a respective access port to all transactions originating from a respective source device.

9. The method according to claim 8, further comprising loading, into one of the plurality of source devices, a software application containing instructions for programming a plurality of respective control words, and programming the plurality of respective control words during an execution of the software application.

10. The method according to claim 8, wherein the respective transaction is incorporated within a respective main word of n bits, wherein the respective control word comprises m additional bits, a value of m being at least equal to one and being dependent on a number of the plurality of access ports to select from, wherein a respective input interface is configured to receive a respective overall word of n+m bits comprising the respective main word and the respective control word.

11. The method according to claim 9, wherein the one of the plurality of source devices comprises a programmable core or a microprocessor.

12. The method according to claim 10, further comprising routing the overall word to the respective output interface, the respective output interface being configured to not deliver the respective control word to the access port coupled to the respective output interface.

13. The method according to claim 10, wherein the respective input interface is coupled to the respective source device by an n-track input bus and to a respective control circuit by an m-track control bus.

14. The method according to claim 13, further comprising routing the respective overall word of n+m bits over a network of n+m track internal buses within the interconnect circuit, each output interface being configured to receive a respective n+m bit internal bus and being coupled to the respective access port by a respective n-track output bus, the m tracks of the respective n+m bit internal bus leading to the respective output interface not being connected to the respective access port.

15. A system on chip, comprising:
a plurality of source devices, each source device having an n-bit main word output;
a target device comprising a plurality of access ports, each access port having an m-bit main word input;
an interconnect circuit comprising a plurality of input interfaces and a plurality of output interfaces, the main word output of each source device coupled to a respective one of the input interfaces and the main word input of each access port coupled to a respective one of the output interfaces; and
a control circuit having an m-bit control word input coupled to each of the input interfaces of the interconnect circuit, wherein the number of access ports of the target devices is less than or equal to $2^m$, wherein the interconnect circuit is configured to route a main word from a selected one of the source devices to an access port indicated by the control word.

16. The system on chip according to claim 15, wherein the interconnect circuit is configured to receive a plurality of bits from the selected one of the source devices and deliver a plurality of bits to the access port indicated by the control word, the bits received from the selected one of the source devices being identical to the bits delivered to the access port indicated by the control word irrespective of which access port is indicated by the control word.

17. The system on chip according to claim 15, wherein the interconnect circuit is configured to receive n+m bits from the selected one of the source devices and to deliver n bits to the access port indicated by the control word.

18. The system on chip according to claim 15, wherein the control circuit comprises a programmable control circuit that is programmable by one of the plurality of source devices.

19. The system on chip according to claim 15, wherein the target device comprises a multiport memory circuit and wherein the main word comprises an address of a physical memory space of the memory circuit.

20. The system on chip according to claim 18, wherein the one of the plurality of source devices comprises a programmable core or a microprocessor.

21. A method of operating a system on chip that includes a plurality of source devices, a target device comprising a plurality of access ports, and an interconnect circuit coupled between the source devices and the target device, the method comprising:
programming a plurality of registers to indicate which access port of the target device is associated with each of the source devices;

delivering an n-bit main word from a selected one of the source devices to the interconnect circuit;

delivering an m-bit control word from a register of the plurality of registers that is associated with the selected one of the source devices to the interconnect circuit, wherein the number of access ports of the target devices is less than or equal to $2^m$; and delivering the n-bit main word from the interconnect circuit to the access port indicated by the m-bit control word, the m-bit control word not being delivered to the access port indicated by the m-bit control word.

22. The method according to claim 21, wherein the programming is performed by one of the source devices.

23. The method according to claim 22, wherein the one of the source devices comprises a programmable core or a microprocessor.

\* \* \* \* \*